United States Patent
Makino et al.

(10) Patent No.: US 9,634,190 B2
(45) Date of Patent: Apr. 25, 2017

(54) WHITE LIGHT-EMITTING ELEMENT

(71) Applicant: National Institute of Advanced Industrial Science and Technology, Tokyo (JP)

(72) Inventors: Toshiharu Makino, Tsukuba (JP); Satoshi Yamasaki, Tsukuba (JP); Hideyo Ookushi, Tsukuba (JP); Masahiko Ogura, Tsukuba (JP); Hiromitsu Kato, Tsukuba (JP); Daisuke Takeuchi, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 0 days.

(21) Appl. No.: 14/775,170

(22) PCT Filed: Mar. 17, 2014

(86) PCT No.: PCT/JP2014/057209
§ 371 (c)(1),
(2) Date: Nov. 20, 2015

(87) PCT Pub. No.: WO2014/142338
PCT Pub. Date: Sep. 18, 2014

(65) Prior Publication Data
US 2016/0126420 A1    May 5, 2016

(30) Foreign Application Priority Data
Mar. 15, 2013    (JP) .................................. 2013-053756

(51) Int. Cl.
*H01L 33/34* (2010.01)
*H01L 33/50* (2010.01)

(52) U.S. Cl.
CPC ............ *H01L 33/343* (2013.01); *H01L 33/34* (2013.01); *H01L 33/50* (2013.01); *H01L 33/508* (2013.01)

(58) Field of Classification Search
CPC .............................. H01L 33/343; H01L 33/50
See application file for complete search history.

(56) References Cited

U.S. PATENT DOCUMENTS

| 6,603,146 B1 | 8/2003 | Hata ................................ 257/79 |
| 2010/0001292 A1 | 1/2010 | Yamasaki ........................ 257/77 |

FOREIGN PATENT DOCUMENTS

| JP | A-2001-085734 | 3/2001 |
| JP | A-2005-057239 | 3/2005 |
| JP | A-2010-182961 | 8/2010 |

OTHER PUBLICATIONS

Toshiharu Makino, et al., "Strong Excitonic Emission from (001)-Oriented Diamond P-*N* Junction," Japanese Journal of Applied Physics, vol. 44, No. 38, (2005), pp. L1190-L1192.
(Continued)

*Primary Examiner* — Matthew Reames
(74) *Attorney, Agent, or Firm* — Ostrolenk Faber LLP

(57) ABSTRACT

A white light-emitting device of the present invention includes a substrate (101); a diamond semiconductor layer (105) provided on the substrate (101), in which one or a plurality of p-type α layers (102), a p-type or n-type γ layer (103), and one or a plurality of n-type β layers (104) are laminated in this order from the substrate (101); a first electrode (106) provided on the α layer (102) which injects an electric current; a second electrode (107) provided on the β layer (104) which injects an electric current; and a fluorescent member (108) which coats a light emission extraction region of the surface of the diamond semiconductor layer.

4 Claims, 9 Drawing Sheets

(56) References Cited

OTHER PUBLICATIONS

Lawrence S. Pan, "Diamond: Electronic Properties and Applications," (1979), pp. 250-252.
J. E. Field, "The Properties of Diamond," (1994), pp. 170-177.
International Search Report dated Apr. 15, 2014 in corresponding International Application No. PCT/JP2014/057209.
Yoshihiro Yokota et al., "Edge emission observed in heavily boron-doped diamond films epitaxially grown on platinum," *Applied Physics Letters*, 73,1493 (1998).

WHITE LIGHT-EMITTING ELEMENT

CROSS-REFERENCE TO RELATED APPLICATIONS

The present application is a 35 U.S.C. §§371 national phase conversion of PCT/JP2014/057209, filed Mar. 17, 2014, which claims priority to Japanese Patent Application No. 2013-053756, filed Mar. 15, 2013, the contents of which are incorporated herein by reference. The PCT International Application was published in the Japanese language.

TECHNICAL FIELD

The present invention relates to a white light-emitting device which can function as a white LED having a high color rendering property.

BACKGROUND ART

An emission spectrum of an LED generally has a peak within a particular wavelength range, and the wavelength ranges on the short wavelength side and the long wavelength side of a particular wavelength range do not have an emission peak more than the measurement limit. In order to obtain a white light (natural light) in which an emission spectrum is distributed continuously and widely, lights having various wavelengths are combined so as to compensate for wavelength ranges which do not have an emission peak more than the measurement limit (FIG. 9 (cited from the Non Patent Literature 1)). However, there are countless wavelength ranges to be compensated for, and it is almost impossible to completely compensate. Therefore, it is difficult to obtain the light having a continuous emission spectrum like a white light by using a conventional LED.

Meanwhile, diamond having the highest dielectric breakdown electric field strength and thermal conductivity among semiconductor materials has been drawing new attention as a material for light-emitting devices. A spectrum of a light emitted by a light range and a visible light range.

However, a peak within a visible light range does not exist within a wavelength range corresponding to a red light, and is unevenly distributed within a wavelength range corresponding to a blue light. In other words, in a white light obtained by using a light-emitting device made of diamond, an amount of a red light component is insufficient relative to an amount of a blue light component. Therefore, regarding a light-emitting device made of diamond, it is difficult to obtain a white light with a high color rendering property which has a continuous light emission spectrum and is formed by uniformly containing respective light components of a visible light range.

CITATION LIST

Patent Literature

[Patent Literature 1]
Japanese Unexamined Patent Application, First Publication No. 2010-182961
[Non Patent Literature]
[Non Patent Literature 1]
LED Technical Term (Nikkei Electronics)
[Non Patent Literature 2]
T. Makino, et. al., Jpn. J. Appl. Phys. 44, L1190 (2005)

[Non Patent Literature 3]
Lawrence S. Pan DIAMOND: ELECTRONIC PROPERTIES AND APPLICATIONS P.250-252

SUMMARY OF INVENTION

Technical Problem

The present invention has been completed in consideration of the aforementioned problems, and an object of the present invention is to provide a white light-emitting device that can emit a white light with a high color rendering property which has a continuous emission spectrum and contains a blue light component and a red light component in a similar proportion within a visible light range.

Solution to Problem

A white light-emitting device of the present invention includes: a substrate; a diamond semiconductor layer provided on the substrate, in which one or a plurality of p-type α layers, a p-type or n-type γ layer, and one or a plurality of n-type β layers are laminated in this order from the substrate; a first electrode provided on the α layer which injects an electric current; a second electrode provided on the β layer which injects an electric current; and a fluorescent member which coats a light emission extraction region of the surface of the diamond semiconductor layer.

In the white light-emitting device of the present invention, the light emission extraction region is an exposed region of the surface of the β layer.

In the white light-emitting device of the present invention, an absorption wavelength of the fluorescent member is included within a wavelength range of a deep ultraviolet light.

In the white light-emitting device of the present invention, a concentration of impurities contained in the γ layer is $1 \times 10^{16}$ [cm$^{-3}$] or more and $1 \times 10^{19}$ [cm$^{-3}$] or less.

Advantageous Effects of Invention

The functional part of a white light-emitting device according to the present invention is formed by diamond, and thus, the spectrum of a light, which is generated by the current injected in the direction passing through the p-type α layer and the n-type layer formed within the functional part, has peaks within a deep ultraviolet range and a blue light range. Because the light absorption wavelength of the fluorescent member is within a range of about 200-350 [nm], the component of a deep ultraviolet light range of the light generated within the white light-emitting device is temporarily absorbed by the fluorescent member and is converted into the component of a red light range on a longer wavelength side, and the component of a red light range is emitted to the outside. By letting the light generated within the white light-emitting device according to the present invention through the fluorescent member, it is possible to obtain a white light with a high color rendering property which contains a blue light component and a red light component in a similar proportion within a visible light range.

DESCRIPTION OF EMBODIMENTS

Figure 1A:
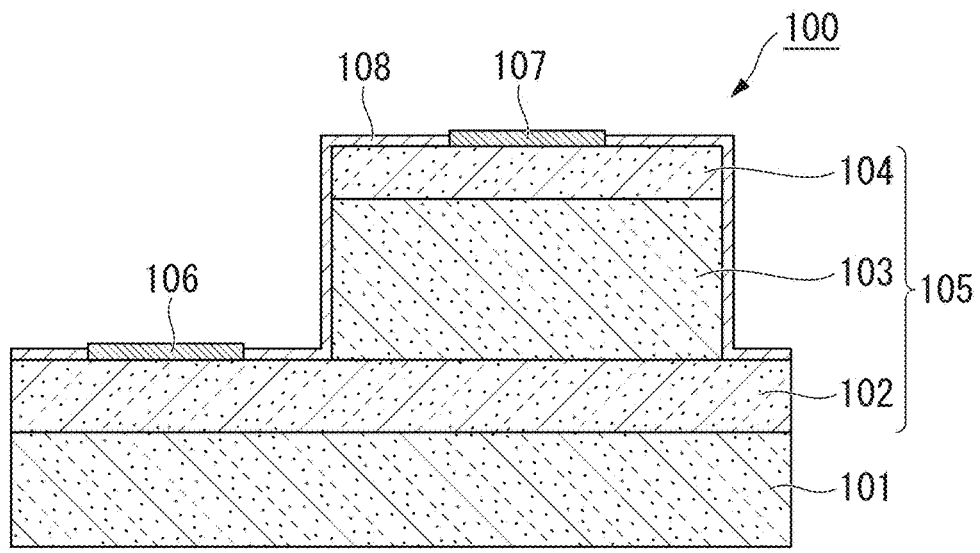
FIG. 1A is the schematic diagram illustrating the cross-sectional structure of a white light-emitting device according to the present invention.

Hereinafter, the present invention is described based on the preferable embodiments with reference to the drawings. The following embodiments have been presented by way of example to describe the spirit of the present invention, and do not limit the scope of the present invention unless otherwise indicated. Also, in the drawings used in the following description, the main sections are enlarged for convenience to clarify the features of the present invention, and the dimensional ratios of the respective components are not necessarily the same as the actual.

First Embodiment

Structure of White Light-Emitting Device

Figure 1B:
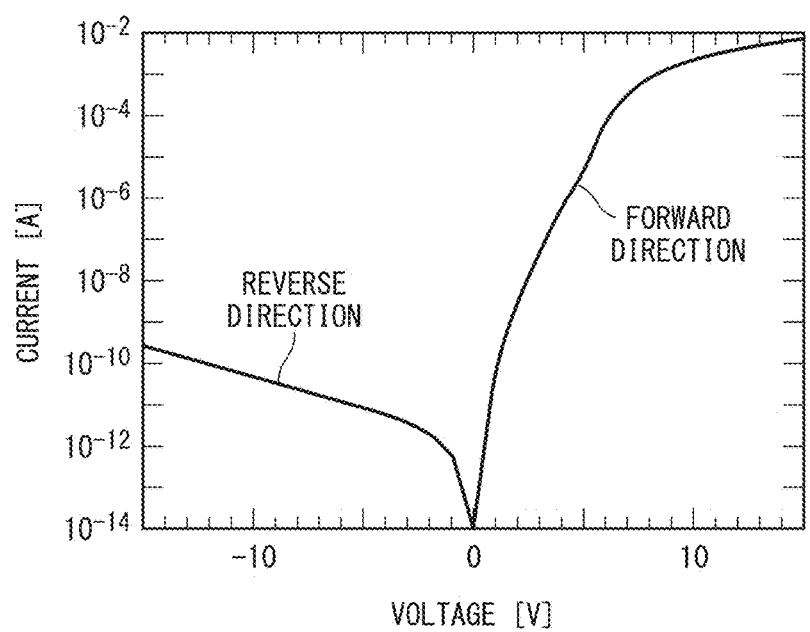
FIG. 1B is the graph showing the current-voltage characteristics of a white light-emitting device according to the present invention.

The structure of the white light-emitting device of the present invention will be described with reference to FIG. 1A, FIG. 1B and FIG. 2. FIG. 1A is the schematic diagram illustrating the cross-sectional structure of the white light-emitting device 100 according to the present invention. The white light-emitting device 100 includes the substrate 101; the diamond semiconductor layer 105 provided on the substrate 101; the first electrode 106 and the second electrode 107 which inject an electric current into the diamond semiconductor layer 105; and the fluorescent member 108 which coats the light emission extraction region of the surface of the diamond semiconductor layer 105. The pn junctions constituting the white light-emitting device 100 have the current-voltage characteristics having a rectifying property as shown in the graph of FIG. 1B.

Usable examples of the base plate 101 include a single crystal base plate, a hetero-epitaxial base plate and a polycrystalline highly-oriented film, and the respective examples are formed by diamond.

The diamond semiconductor layer 105 is formed by laminating one or a plurality of p-type α layers 102, a p-type or n-type γ layer 103, and one or a plurality of n-type β layers 104 in this order from the substrate 101. It is preferable that boron (B) be contained in the α layer 102 as an impurity at a concentration of $1\times10^{17}$ [cm$^{-3}$] or more and $1\times10^{21}$ [cm$^{-3}$] or less. Also, it is preferable that phosphorus (P) be contained in the γ layer 103 as an impurity at a concentration of $1\times10^{17}$ [cm$^{-3}$] or more and $1\times10^{21}$ [cm$^{-3}$] or less. The types of impurities in the α layer and they layer are not limited to the boron and phosphorus, and nitrogen can be used.

Herein, the diamond semiconductor layer 105 can be formed by laminating in the reverse order of FIG. 1A, i.e. laminating the n-type β layer 104, the p-type or n-type γ layer 103, and the p-type α layer 102 in this order from the substrate 101.

The first electrode 106 is provided on the α layer 102, and functions as an electrode for injecting a current (holes) from an external circuit to the α layer 102. The second electrode 107 is provided on the β layer 104, and functions as an electrode for injecting a current (electrons) from an external circuit to the β layer 104. Both of the electrodes (106, 107) are constituted by a conventionally known conductive member.

The fluorescent member 108 has the functions of absorbing a deep ultraviolet light having a wavelength range of about 200-350 [nm], converting it into a red light having a wavelength range of about 620-800 [nm] and emitting this red light. Examples of the material constituting the fluorescent member 108 include YAG (yttrium aluminum garnet) based materials, TAG (terbium-aluminum-garnet) based materials, sialon based materials, BOS (barium orthosilicate) based materials and the materials containing a light-emitting device such as silicate based materials.

The main light emission extraction region of the white light-emitting device 100 (the diamond semiconductor layer 105) is the exposed region of the surface of the β layer 104. The fluorescent member 108 coats at least a part of the exposed region. In order to increase the intensity of the light emission, it is desirable that the fluorescent member 108 coat a broad area of β layer 104.

Because both of the diamond semiconductor layer 105 formed of diamond and the substrate 101 are transparent, the light emission can be extracted from the part other than the β layer 104 (the α layer 102, the γ layer 103 and the substrate 101). In other words, the exposed region of the part other than the β layer 104 can also be the light emission extraction region. Therefore, when the fluorescent member 108 coats these exposed regions, it is possible to improve the intensity of light emission.

There is no limitation to the form of the fluorescent member 108, and it may be a powder form or a film form. The fluorescent member 108 can be formed as a film having a uniform thickness on the surface which becomes the light emission extraction region. In this case, it is possible to emit a light having a uniform intensity in a specific direction.

Also, the fluorescent member 108 can be formed as a film having a textured structure on the surface which becomes the light emission extraction region. In this case, it is possible to emit a light in a lot of directions. It is preferable that at least the connection parts of an external circuit and the first and second electrodes be exposed, and the fluorescent member can be provided at the part other than the connection parts.

Figure 2:
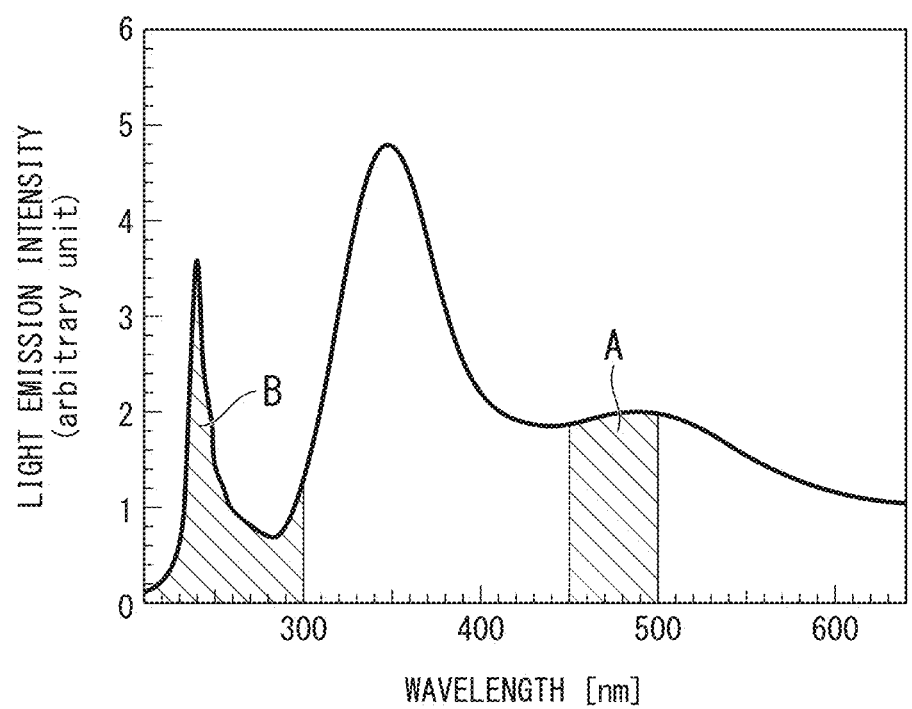
FIG. 2 is the graph showing the light emission property of a white light-emitting device which does not include a fluorescent member of a white light-emitting device according to the invention.

FIG. 2 is the graph showing the light emission property (spectrum) of the white light-emitting device 100. This graph shows the spectrum of the light, which is detected before being absorbed by the fluorescent member 108, among the light generated within the white light-emitting device 100. In other words, the spectrum shown in the graph of FIG. 2 corresponds to the spectrum of the light generated by the white light-emitting device in which the fluorescent member 108 is not provided. The vertical axis of the graph represents an intensity of a light (light emission intensity), and the horizontal axis represents a wavelength of a light.

Among the light components obtained by the white light-emitting device 100, the integrated value A within the blue light range at wavelength 450 [nm] or more and 500 [nm] or less has a similar value to the integrated value B within the deep ultraviolet light range at the wavelength of 300 [nm] or less as shown in FIG. 2. The integrated value A within the blue light range is proportional to the amount of defects originated from impurities contained in the γ layer 103. Therefore, it is possible to adjust the integrated value A by increasing or decreasing the concentration of impurities of the γ layer 103.

Specifically, when the γ layer 103 contains boron (B) as an impurity at a concentration of $1\times10^{16}$ [cm$^{-3}$] or more and $1\times10^{19}$ [cm$^{-3}$] or less, for example, the integrated value A has a similar value to the integrated value B. However, the impurity used to adjust the integrated value A is not limited to boron, and it is possible to use other impurities such as phosphorus and nitrogen.

In the present embodiment, it is defined that the integrated value A has a similar value to the integrated value B when the integrated value A is one or more times and not more than 10 times of the integrated value B.

As described above, the functional part of the white light-emitting device according to the first embodiment is formed by diamond, and thus, the spectrum of a light, which is generated by the current injected in the direction passing through the p-type α layer and the n-type β layer formed within the functional part, has peaks within a deep ultraviolet range and a blue light range. Because the light absorption wavelength of the fluorescent member is within a range of about 200-350 [nm], the component of a deep ultraviolet light range of the light generated within the white light-emitting device is temporarily absorbed by the fluorescent member and is converted into the component of a red light range on a longer wavelength side, and the component of a red light range is emitted to the outside.

In the first embodiment, a concentration of impurities contained in the γ layer located between the α layer and the β layer is adjusted such that the deep ultraviolet light range component has a similar value to the blue light range component in an integrated value of the intensity of a generated light. Therefore, the red light range component obtained by converting the deep ultraviolet light range component also has a similar value to the blue light range component in an integrated value of a light intensity. For this reason, by letting the light generated within the white light-emitting device according to the present invention through the fluorescent member, it is possible to obtain a white light with a high color rendering property which contains a blue light component and a red light component in a similar proportion within a visible light range.

Production Method of White Light-Emitting Device

Figure 3A:
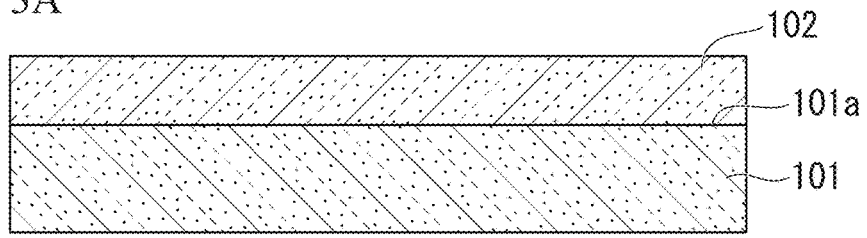
FIG. 3A is the diagram explaining the production method of a white light-emitting device according to the present invention in a stepwise manner.

The production method of the white light-emitting device 100 according to the first embodiment will be described with reference to FIG. 3A to FIG. 3C and FIG. 4A to FIG. 4C. In the first step, the α layer 102 containing p-type impurities at a desired concentration is formed on the one surface 101a of the substrate 101 (FIG. 3A).

As the reaction gas used in the formation of the α layer 102, $CH_4/H_2$ is desirably used at 0.001[%] or more and 10[%] or less, and $B_2H_6/CH_4$ is desirably used at 10 [ppm] or more and 500000 [ppm] or less. Also, $CH_4/H_2$ is more desirably used at 0.01[%] or more and 1[%] or less, and $B_2H_6/CH_4$ is more desirably used at 100 [ppm] or more and 10000 [ppm] or less. Moreover, $CH_4/H_2$ is much more desirably used at 0.15[%], and $B_2H_6/CH_4$ is much more desirably used at 500 [ppm].

Also, when forming the α layer 102, the temperature of the treatment space is desirably 600[° C.] or more and 1300[° C.] or less, and the pressure of the treatment space is desirably 5 [Torr] or more and 200 [Torr] or less. Also, the power of the microwave used in the formation of the α layer 102 is desirably 300 [W] or more and 60 [kW] or less.

Figure 3B:
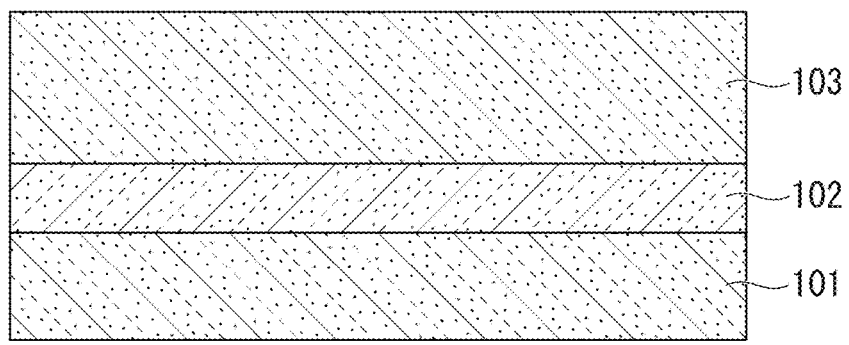
FIG. 3B is the diagram explaining the production method of a white light-emitting device according to the present invention in a stepwise manner.

In the second step, the γ layer 103 containing p-type impurities or n-type impurities at a desired concentration is formed on the α layer 102 (FIG. 3B).

As the reaction gas used in the formation of the γ layer 103, $CH_4/H_2$ is desirably used at 0.001[%] or more and 10[%] or less, more desirably 0.01[%] or more and 1[%] or less, and much more desirably 0.025[%].

Also, when forming the γ layer 103, the temperature of the treatment space is desirably 600[° C.] or more and 1300[° C.] or less, and the pressure of the treatment space is desirably 5 [Torr] or more and 200 [Torr] or less. Also, the power of the microwave used in the formation of the γ layer 103 is desirably 300 [W] or more and 60 [kW] or less.

Figure 3C:
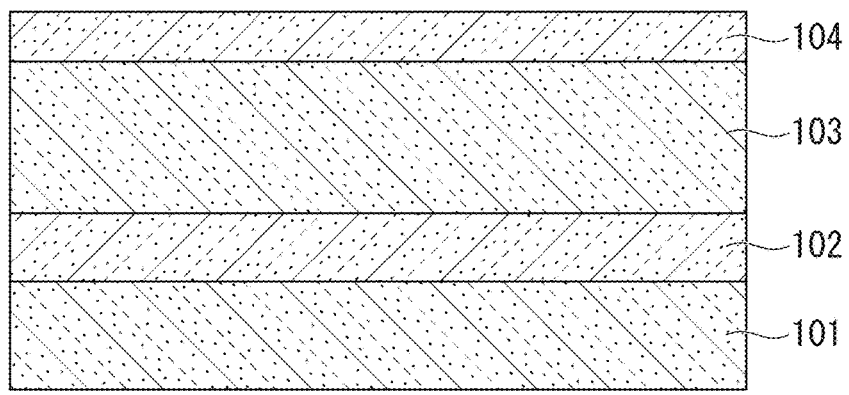
FIG. 3C is the diagram explaining the production method of a white light-emitting device according to the present invention in a stepwise manner.

In the third step, the β layer 104 containing n-type impurities at a desired concentration is formed on the γ layer 103 (FIG. 3C).

As the reaction gas used in the formation of the β layer 104, $CH_4/H_2$ is desirably used at 0.001[%] or more and 10[%] or less, and $PH_4/CH_4$ is desirably used at 0.5[%] or more and 90[%] or less. Also, $CH_4/H_2$ is more desirably used at 0.01[%] or more and 1[%] or less, and $PH_4/CH_4$ is more desirably used at 30[%] or more and 70[%] or less. Moreover, $CH_4/H_2$ is much more desirably used at 0.05[%], and $PH_4/CH_4$ is much more desirably used at 55[%].

Also, when forming the β layer 104, the temperature of the treatment space is desirably 600[° C.] or more and 1300[° C.] or less, and the pressure of the treatment space is desirably 5 [Torr] or more and 200 [Torr] or less. Also, the power of the microwave used is preferably 300 [W] or more and 60 [kW] or less.

Figure 4A:
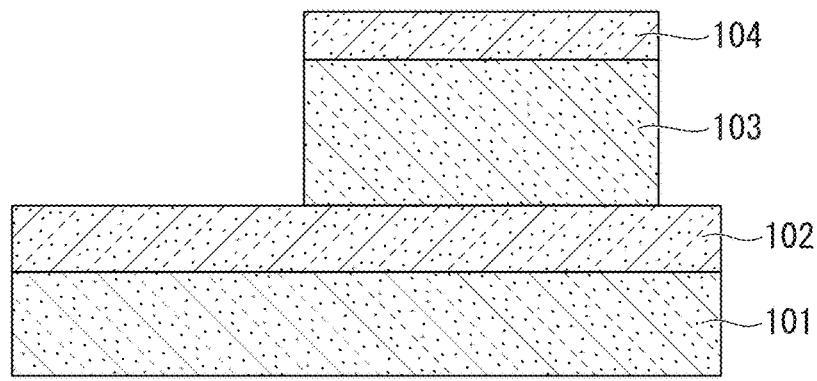
FIG. 4A is the diagram explaining the production method of a white light-emitting device according to the present invention in a stepwise manner.

In the fourth step, the γ layer 103 and the β layer 104 are removed by etching such that the α layer 102 is exposed at least in the region in which the first electrode 106 is formed (FIG. 4A). In this step, the α layer can be processed by removing a part of the exposed surface of the α layer 102 so as to adjust the thickness to a desired thickness.

Figure 4B:
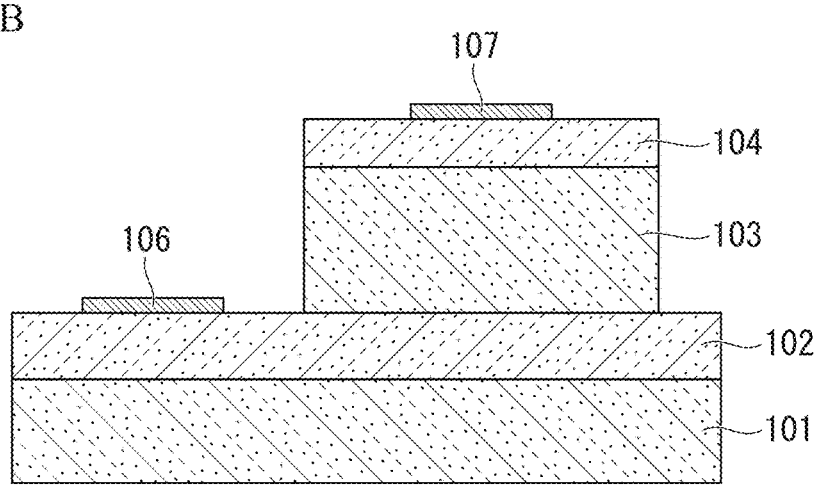
FIG. 4B is the diagram explaining the production method of a white light-emitting device according to the present invention in a stepwise manner.

In the fifth step, the first electrode 106 is formed on the exposed surface of the α layer 102, and the second electrode 107 is formed on the exposed surface of the β layer 104 (FIG. 4B).

Figure 4C:
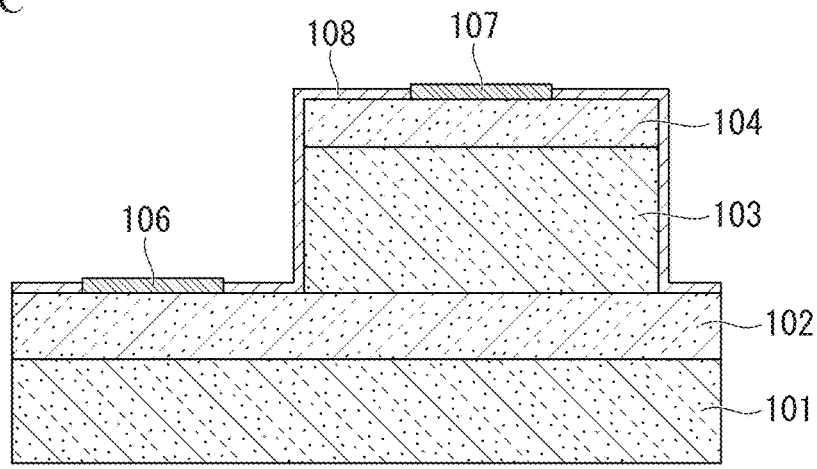
FIG. 4C is the diagram explaining the production method of a white light-emitting device according to the present invention in a stepwise manner.

In the sixth step, the fluorescent member 108 is provided on the surface of the diamond semiconductor layer 105 made of the α layer, the γ layer and the β layer (FIG. 4C). The fluorescent member 108 is desirably provided so as to uniformly coat the wide area of the surface of the diamond semiconductor layer 105.

By carrying out the aforementioned first to sixth steps, it is possible to carry out the white light-emitting device 100 according to the first embodiment.

Production Apparatus of White Light-Emitting Device

Figure 5:
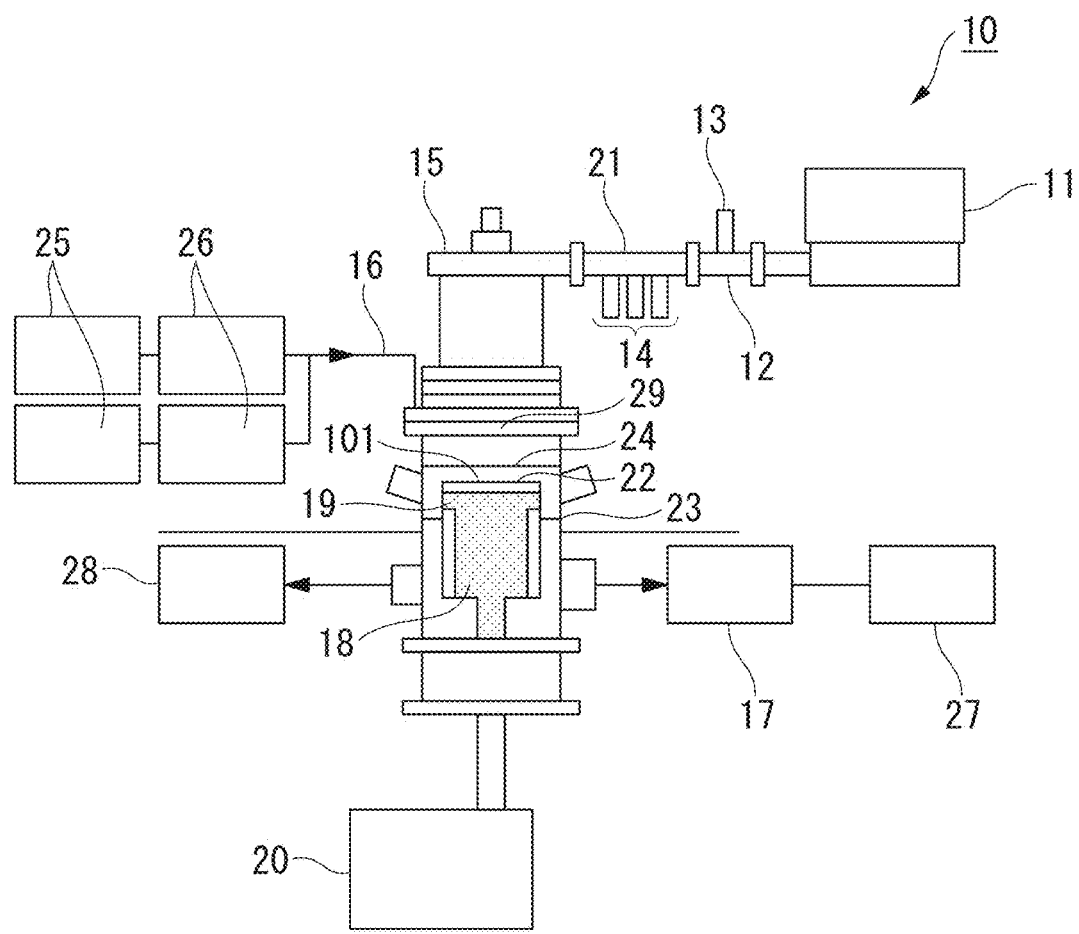
FIG. 5 is the schematic diagram illustrating the cross-sectional structure of the production apparatus of a diamond semiconductor layer of a white light-emitting device according to the present invention.

The production apparatus of the diamond semiconductor device 105, which constitutes the functional part of the white light-emitting device 100 according to the first embodiment, will be described with reference to FIG. 5. FIG. 5 is the schematic diagram illustrating the structure of the microwave plasma CVD apparatus 10 which is used as the production apparatus of the diamond semiconductor layer 105.

The microwave plasma CVD apparatus 10 is an end launch type in which a microwave is entered in the normal direction to the base plate (substrate) 101. The microwave source 11 emits a microwave having 2.45 [GHz], and the maximum power is 1.5 [kW], and the power can be adjusted as necessary.

In the subsequent stage of the microwave source 11, the circulator 12 and the dummy load 13 are provided such that the reflected microwave returning to the waveguide 21 is heat-absorbed through water load among the microwaves emitted from the microwave source 11. For this reason, it is prevented that the reflection wave adversely affects the oscillator of the microwave source 11.

Also, the tuner 14 is provided in the subsequent stage of the circulator 12, and the impedance of the waveguide 21 is adjusted by three rods. Through this operation, the reflection of microwaves can be suppressed and the total incident power can be consumed as plasma. In addition, the applicator 15 having an antenna protruding into the waveguide 21 is provided in the subsequent stage of the tuner 14 such that the microwave of TE10 mode that has propagated through the waveguide 21 is converted into the microwave of concentric TM01 mode. By preparing the microwave of TM01 mode, the microwave is matched in the cylinder-shaped reaction vessel 23, and it is possible to obtain stable plasma.

The raw material gas is a mixed gas of a methane gas, which is a carbon source, a hydrogen gas and an impurity doping gas. The respective gases are introduced from the respective gas cylinder 25 through pressure-reducing valves and the mass flow controllers 26 and the gas introduction pipe 16 to the reaction vessel 23. When being introduced into the reaction vessel 23, the respective gases become gas shower through the shower head 29 at the top of the reaction vessel 23. The mass flow controller of the methane side should be a highly accurate one in order to obtain a mixing ratio (i.e. the ratio of a methane gas to hydrogen gas) of 0.5[%] or less.

During the CVD diamond synthesis process, outgassing is carried out by the process pump 28 so as to control a gas pressure within the reaction vessel 23. Through this operation, the diamond synthesis process proceeds by a plasma CVD. Also, the turbo pump 17 is used to obtain a high vacuum in preliminary outgassing, and the rotary pump 27 is used to carry out outgassing during the synthesis. Moreover, the high-frequency induction heater 20 is used to control a temperature of the base plate 101.

The base plate 101 is set at the predetermined position after opening the sample replacement door 24. In other words, the susceptor 19 such as a graphitic susceptor is provided on the stage 18 within the reaction vessel 23, and the base plate 101 is set in the base plate folder 22 placed on the susceptor 19.

EXAMPLES

Hereinafter, the present invention will be further specifically described using Example 1 corresponding to the first embodiment, but examples which can carry out the present invention is not limited to Example 1.

Example 1

Example 1 of the aforementioned white light-emitting device will be described with reference to FIG. 6A, FIG. 6B, FIG. 7, FIG. 8A and FIG. 8B.

Figure 6A:
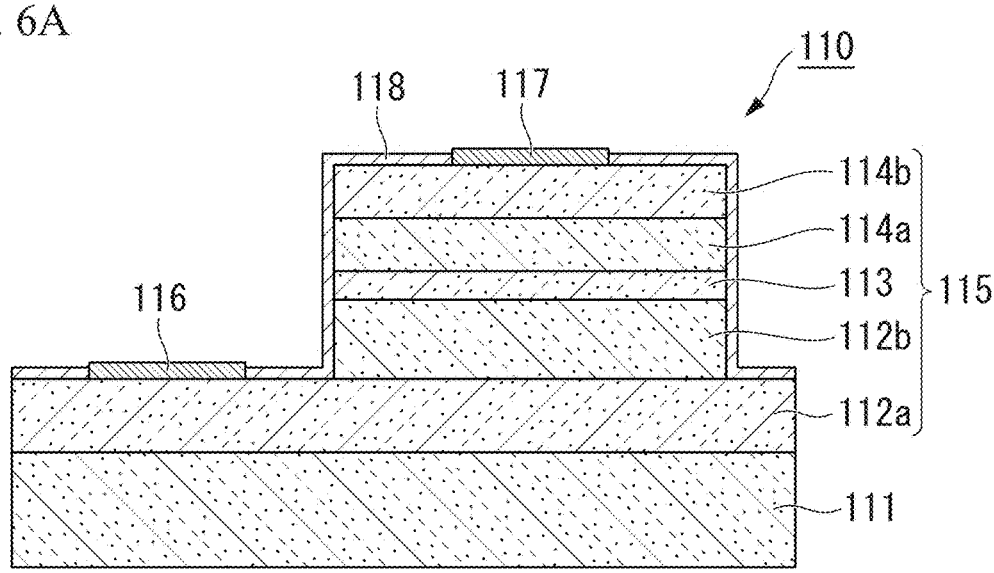
FIG. 6A is the schematic diagram illustrating the cross-sectional structure of a white light-emitting device according to Example 1 of the present invention.

FIG. 6A is the schematic diagram illustrating the cross-sectional structure of the white light-emitting device 110 used in Example 1. The white light-emitting device 110 was used, which had the same laminate structure as the white light-emitting device 100 according to the first embodiment. As the substrate 111, the base plate was used, which was made of the diamond having the crystal structure aligning in the (111) direction. The diamond semiconductor layer 115 was constituted by laminating the al layer (the α layer) 112a, the α2 layer (the α layer) 112b, the γ layer 113, the β1-layer (the β layer) 114a, the β2 layer (the β layer) 114b in this order from the side of the substrate 111, and the thicknesses of these layers were 2 [μm], 1 [μm], 200 [nm], 500 [nm] and 500 [nm], respectively.

Also, the film of the fluorescent member 118 was formed on the β2 layer. The thickness of the film was 200 [nm].

Boron was contained in the α1 layer 112a and the α2 layer 112b at the concentrations of $2 \times 10^{20}$ [cm$^{-3}$] and $2 \times 10^{19}$ [cm$^{-3}$], respectively. Nitrogen was contained in the γ layer 113 at the concentration of $2 \times 10^{17}$ [cm$^{-3}$]. Also, phosphorus was contained in the β1 layer 114a and the β2 layer 114b at the concentrations of $6 \times 10^{17}$ [cm$^{-3}$] $1 \times 10^{20}$ [cm$^{-3}$], respectively. Herein, the impurity concentration of the γ layer 113 was adjusted such that, among the emitted light components, the integrated value A of the intensity of the blue light has a similar value to the integrated value B of the intensity of the deep ultraviolet light.

The calcium silicate was used as the material of the fluorescent member 118.

Figure 6B:
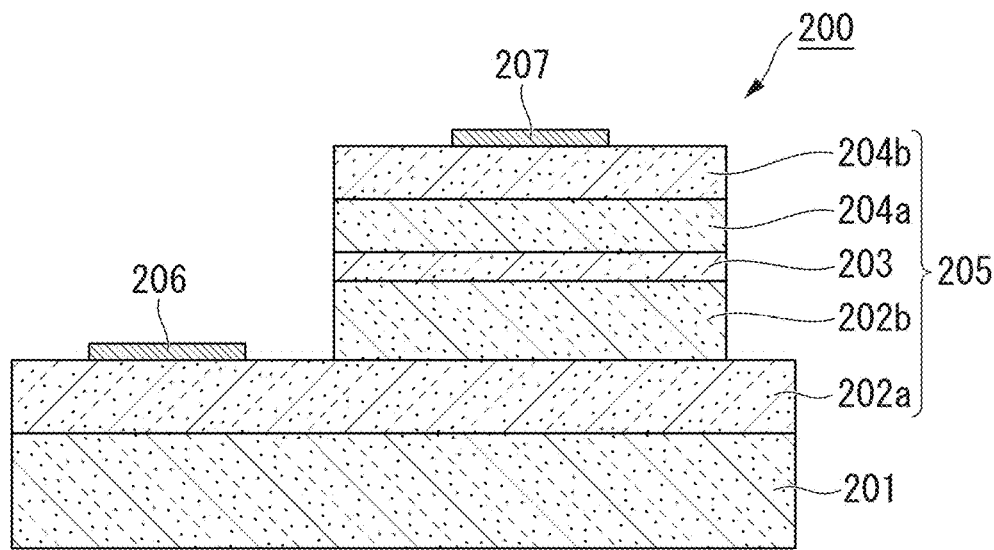
FIG. 6B is the schematic diagram illustrating the cross-sectional structure of a conventional white light-emitting device.

FIG. 6B is the schematic diagram illustrating the cross-sectional structure of the conventional white light-emitting device 200 including no fluorescent member. The white light-emitting device 200 included the substrate 201; the diamond semiconductor layer 205 constituted by laminating the α1 layer 202a, the α2 layer 202b, the γ layer 203, the β1-layer 204a, the β2 layer 204b in this order; and the first electrode 206 and the second electrode 207 provided on the α1 layer 202a and the β2 layer 204b, respectively. The structure other than the fluorescent member was the same as the white light-emitting device 110 according to Example 1 shown in FIG. 6A.

Figure 7:
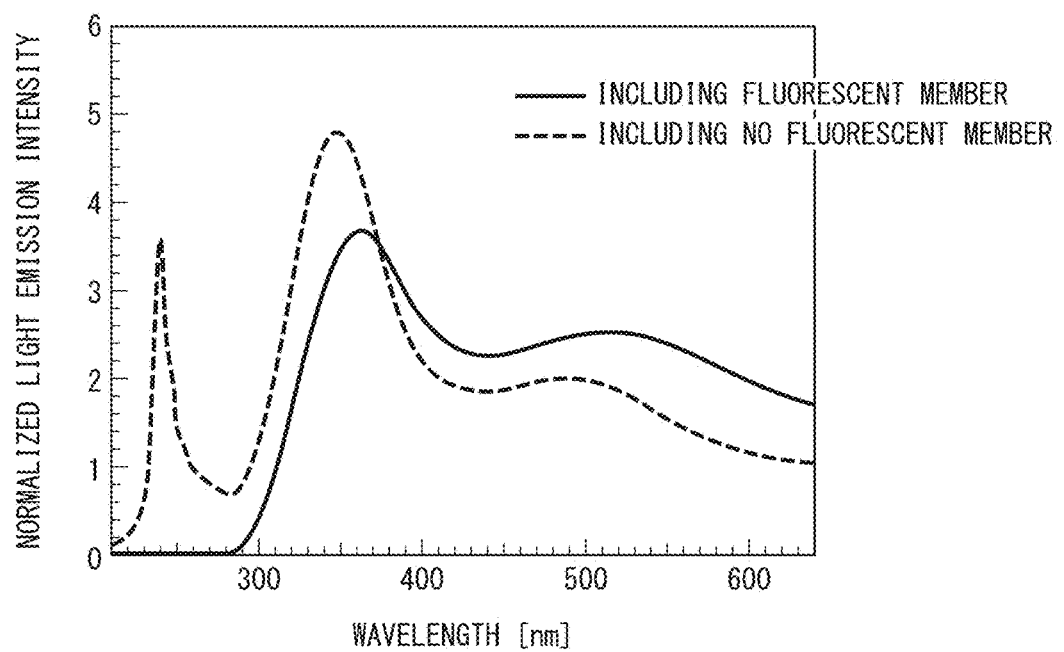
FIG. 7 is the graph comparing the light emission property of the white light-emitting device according to Example 1 of the present invention with the light emission property of the conventional white light-emitting device.

FIG. 7 is the graph comparing the light emission property of the white light-emitting device 110 of the present invention shown in FIG. 6A with the light emission property of the conventional white light-emitting device 200 shown in FIG. 6B. The vertical axis of the graph represents a light emission intensity, and the horizontal axis represents a wavelength of a light. The respective emission intensities of the white light-emitting devices were normalized such that the integrated intensity in the case of including the fluorescent member became equal to the integrated intensity in the case of including no fluorescent member. The solid line indicates the light emission property of the white light-emitting device 110 of the present invention, and the broken line indicates the light emission property of the conventional white light-emitting device 200 including no fluorescent member.

Herein, the light emission property was obtained by respectively injecting the holes and the electrons into the α layers and the β layers of the white light-emitting elements 110 and 200, and measuring the intensities of the lights emitted by the recombination of the injected holes and electrons in the γ layers 113 and 203.

In the spectrum of the conventional white light-emitting device 200 including no fluorescent member, the peaks were observed within the deep ultraviolet light range at the wavelength of about 300 [nm] or less, the ultraviolet light range at the wavelength of about 300 to 400 [nm], and the blue light region at about 450 to 500 [nm]. In the light generated by the conventional white light-emitting device, the blue light component was more contained than the red light component among the light components within the visible light range.

Meanwhile, in the spectrum of the white light-emitting device 110 of the present invention, the peak was observed only within the ultraviolet light range. The spectrum was continuously spread within the visible light range, and the peak was not observed. Within the deep ultraviolet light region, the emission intensity was not more than the measurement limit. Within the visible light range at the wavelength of about 400 to 800 [nm], the wavelength dependency of the light emission intensity was small, and the almost flat spectrum was obtained with respect to the horizontal axis of the graph. In other words, the light generated by the white light-emitting device 110 of the present invention rarely contained the deep ultraviolet light component, and the red light component was contained in the similar proportion to the blue light component.

Figure 8A:
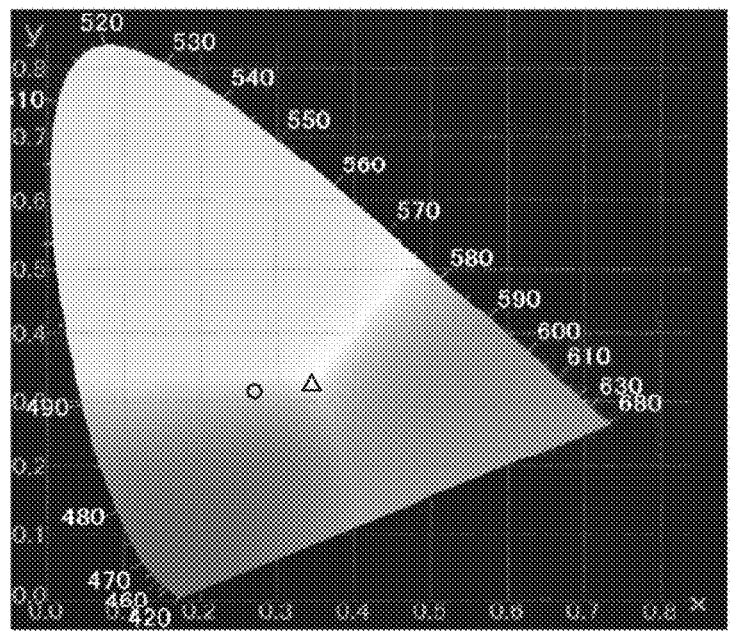
FIG. 8A is the CIE chromaticity table showing the characteristics of the conventional white light-emitting device.

The color rendering property of the lights generated by the respective white light-emitting devices 200 and 110 will be described with reference to FIG. 8A and FIG. 8B. FIG. 8A is the CIE chromaticity table showing the color rendering property of the light generated by the conventional white light-emitting device 200 including no fluorescent member. According to the CIE chromaticity table of FIG. 8A, the chromaticity value (indicated by a ○ mark) of the light had the properties of X=0.270, and Y=0.313, and was shifted to the blue side in comparison with the chromaticity value (indicated by a Δ mark) of the white light (natural light).

This indicates that the light generated by the white light-emitting element 200 including no fluorescent member contains a lot of the blue light component as compared to the original white light.

Figure 8B:
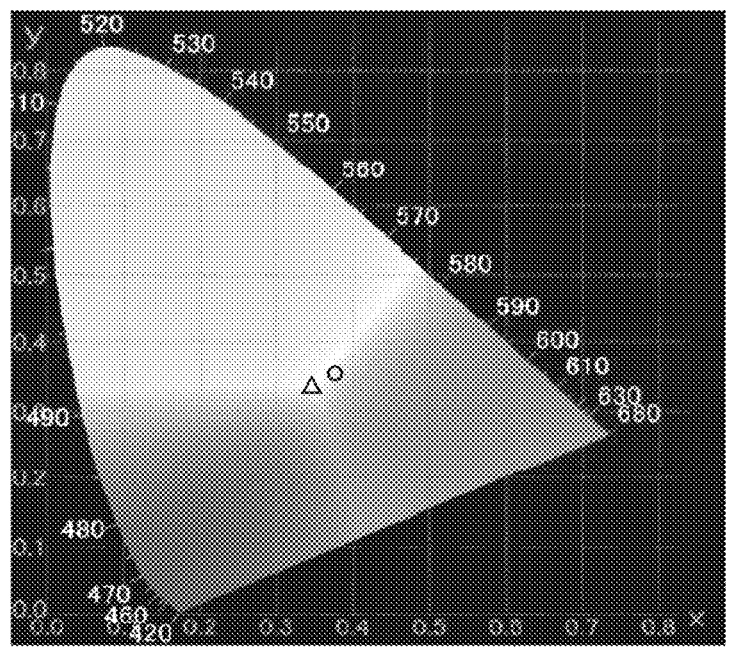
FIG. 8B is the CIE chromaticity table showing the characteristics of the white light-emitting device according to Example 1 of the present invention.
Figure 9:
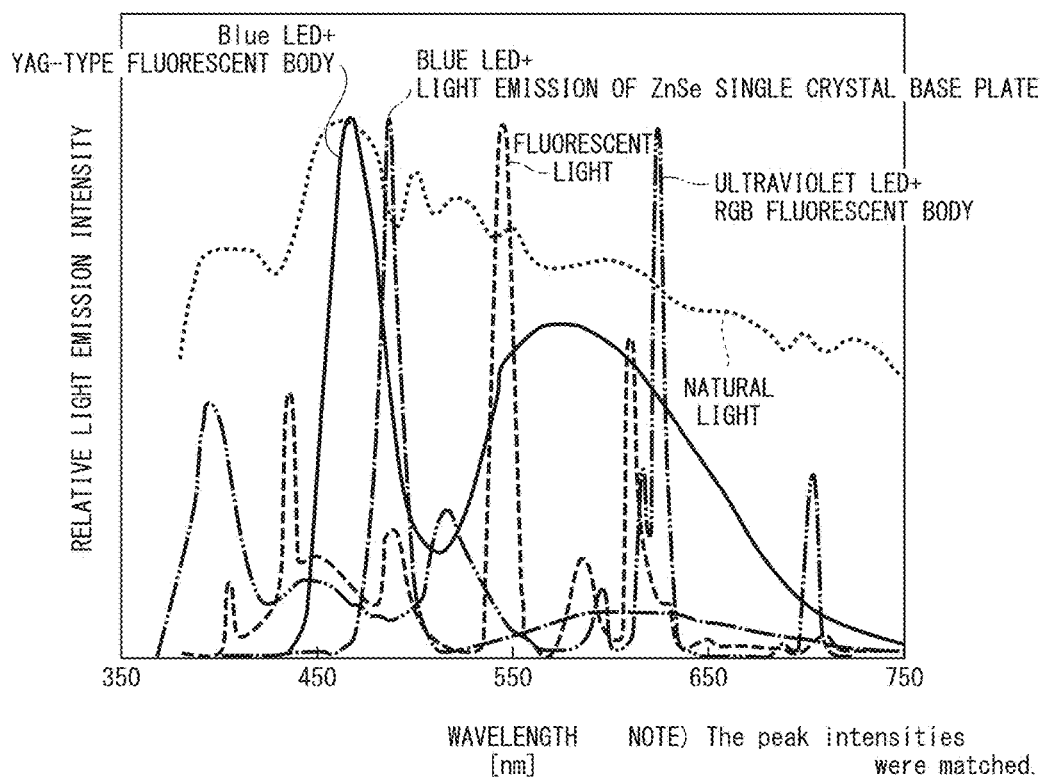
FIG. 9 is the graph showing the light emission spectrum obtained by a conventionally used white light-emitting device.

FIG. 8B is the CIE chromaticity table showing the color rendering property of the light generated by the white light-emitting device 110 of the present invention which included the fluorescent member 118. According to the CIE chromaticity table of FIG. 8B, the chromaticity value (indicated by a ○ mark) of the light had the properties of X=0.295, and Y=0.339, and was more shifted to the red side than the chromaticity value of the light generated by the conventional white light-emitting device 200 including no fluorescent member, and closed to the chromaticity value (indicated by a Δ mark) of the white light.

From the results shown in FIG. 7, FIG. 8A and FIG. 8B, it was found that the light obtained by the white light-emitting device 110 of the present invention had a continuous light emission spectrum and became the white light having a high color rendering property in comparison with the light obtained by the conventional white light-emitting device 200 because of including the fluorescent member 118.

This result is attributed to the fact that, among the light generated in the diamond semiconductor layer, the deep ultraviolet light component was shifted to the longer wavelength side through the interaction with the fluorescent member, and was changed into the red light component.

INDUSTRIAL APPLICABILITY

The present invention can be widely applied to electronic devices using a light emitting device such as an LSI, a DRAM, a power device and an LED.

REFERENCE SIGNS LIST 100, 110, 200: White light-emitting device
101, 111, 201: Substrate
102, 112a, 112b, 202a, 202b: α layers
103, 113, 203: γ layer
104, 114a, 114b, 204a, 204b: β layer
105, 115, 205: Diamond semiconductor layer
106, 116, 206: First electrode
107, 117, 207: Second electrode
108, 118: Fluorescent member

The invention claimed is:
1. A white light-emitting device comprising:
a substrate;
a diamond semiconductor layer provided on the substrate, the diamond semiconductor layer comprising one or more p-type α layers, a p-type or n-type γ layer, and at least one n-type β layer laminated in this order from the substrate;
a first electrode provided on the α layer, the first electrode positioned and configured to inject an electric current;
a second electrode provided on the β layer, the second electrode positioned and configured to inject an electric current; and
a fluorescent member which coats a light emission extraction region of the surface of the diamond semiconductor layer,
wherein a concentration of impurities contained in the γ layer is adjusted such that the integrated value A within the blue light range at wavelength 450 nm or more and 500 nm or less has a relationship to the integrated value B within the deep ultraviolet light range at wavelength 300 nm or less, the relationship being that the integrated value A is at least 1 and at most 10 times the integrated value B.

2. The white light-emitting device according to claim 1, wherein the light emission extraction region is an exposed region of the surface of the β layer.

3. The white light-emitting device according to claim 1, wherein an absorption wavelength of the fluorescent member is included within a wavelength range of a deep ultraviolet light.

4. The white light-emitting device according to claim 1, wherein a concentration of impurities contained in the γ layer is $1\times10^{16}$ [cm$^{-3}$] or more and $1\times10^{19}$ [cm$^{-3}$] or less.

* * * * *